(12) United States Patent
Ahmed et al.

(10) Patent No.: US 9,520,435 B2
(45) Date of Patent: Dec. 13, 2016

(54) IMAGE SENSOR ILLUMINATED AND CONNECTED ON ITS BACK SIDE

(71) Applicants: STMicroelectronics SA, Montrouge (FR); STMicroelectronics (Crolles 2) SAS, Crolles (FR)

(72) Inventors: Nayera Ahmed, Crolles (FR); Michel Marty, Saint Paul de Varces (FR)

(73) Assignees: STMicroelectronics SA, Montrouge (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 14/840,665

(22) Filed: Aug. 31, 2015

(65) Prior Publication Data

US 2016/0172404 A1 Jun. 16, 2016

(30) Foreign Application Priority Data

Dec. 15, 2014 (FR) ...................................... 14 62456

(51) Int. Cl.
*H01L 31/18* (2006.01)
*H01L 27/146* (2006.01)

(52) U.S. Cl.
CPC ..... *H01L 27/14636* (2013.01); *H01L 27/1462* (2013.01); *H01L 27/1463* (2013.01); *H01L 27/1464* (2013.01); *H01L 27/14632* (2013.01); *H01L 27/14683* (2013.01); *H01L 27/14687* (2013.01); *H01L 27/14689* (2013.01)

(58) Field of Classification Search
CPC .................... H01L 27/14605; H01L 27/14612; H01L 27/14621; H01L 27/14625; H01L 27/14627; H01L 27/1463; H01L 27/14632; H01L 27/14636; H01L 27/14643; H01L 27/14645; H01L 27/14687; H01L 27/14689; H01L 27/307; H01L 37/3246; H01L 27/3248; H01L 27/3258; H01L 31/0232

See application file for complete search history.

(56) References Cited

U.S. PATENT DOCUMENTS

| 6,809,008 | B1 | 10/2004 | Holm et al. |
| 2008/0308890 | A1* | 12/2008 | Uya ................... H01L 27/14603 257/437 |
| 2010/0109113 | A1 | 5/2010 | Jang |
| 2010/0237451 | A1 | 9/2010 | Murakoshi |
| 2011/0084350 | A1 | 4/2011 | Murakoshi et al. |
| 2011/0207258 | A1 | 8/2011 | Ahn et al. |
| 2012/0153127 | A1* | 6/2012 | Hirigoyen ......... H01L 27/14609 250/208.1 |
| 2012/0261783 | A1 | 10/2012 | Prima et al. |

(Continued)

*Primary Examiner* — Pamela E Perkins
(74) *Attorney, Agent, or Firm* — Seed IP Law Group LLP

(57) ABSTRACT

An image sensor including a semiconductor layer; a stack of insulating layers resting on the back side of the semiconductor layer; a conductive layer portion extending along part of the height of the stack and flush with the exposed surface of the stack; laterally-insulated conductive fingers extending through the semiconductor layer from its front side and penetrating into said layer portion; laterally-insulated conductive walls separating pixel areas, these walls extending through the semiconductor layer from its front side and having a lower height than the fingers; and an interconnection structure resting on the front side of the semiconductor layer and including vias in contact with the fingers.

14 Claims, 4 Drawing Sheets

(56) References Cited

U.S. PATENT DOCUMENTS

2012/0313208 A1* 12/2012 Kim ................ H01L 27/14634
257/435
2013/0323875 A1* 12/2013 Park ................ H01L 31/022408
438/70
2014/0015600 A1    1/2014 Sato

* cited by examiner

IMAGE SENSOR ILLUMINATED AND CONNECTED ON ITS BACK SIDE

This application claims the priority benefit of French Patent application number 14/62456, filed on Dec. 15, 2014, the contents of which is hereby incorporated by reference in its entirety to the maximum extent allowable by law.

BACKGROUND

Technical Field

The present disclosure relates to an image sensor and to a method for manufacturing the same.

Description of the Related Art

Image sensors comprising a semiconductor layer having a first side, called back side, intended to receive an illumination, and having a second side, called front side, coated with an interconnection structure, are known. Components such as transistors are also currently formed on the front side. Such image sensors where insulated connections run from the interconnection structure up to the back side through the semiconductor layer are here considered. Such insulated connections are generally formed in openings which are wide as compared with the width of insulating walls formed between pixel areas of the image sensor, the insulating walls being formed from the front side and the wide openings being formed from the back side.

This type of image sensor has various disadvantages, some of which are desired to be overcome herein.

BRIEF SUMMARY

Thus, an embodiment comprises an image sensor comprising a semiconductor layer; a stack of insulating layers resting on the back side of the semiconductor layer; a conductive layer portion extending along part of the height of the stack and flush with the exposed surface of the stack; laterally-insulated conductive fingers extending through the semiconductor layer from its front side and penetrating into said layer portion; laterally-insulated conductive walls separating pixel areas, the walls extending through the semiconductor layer from its front side and having a lower height than the fingers; and an interconnection structure resting on the front side of the semiconductor layer and comprising vias in contact with the fingers.

According to an embodiment, the semiconductor layer is made of silicon.

According to an embodiment, the stack successively comprises a first silicon oxide layer resting on the back side, a silicon nitride layer, and a second silicon oxide layer.

According to an embodiment, the walls cross the first oxide layer and penetrate into the silicon nitride layer, the fingers cross the first oxide layer and the silicon nitride layer, and said layer portion extends along the entire height of the second oxide layer.

According to an embodiment, the walls and the fingers are made of doped polysilicon lined with an insulating layer.

According to an embodiment, the width of the walls and of the fingers is smaller than 0.5 µm.

An embodiment provides a method of manufacturing an image sensor comprising the successive steps of:

a) forming a stack of insulating layers on the back side of a semiconductor layer;

b) simultaneously etching from the front side of the semiconductor layer first trenches and second trenches shallower than the first ones, the first trenches penetrating into said stack, the second trenches separating pixel areas of the image sensor;

c) forming an insulating layer on the walls of the first and second trenches;

d) filling the first and second trenches with a first conductive material;

e) on the front side of the semiconductor layer, forming an interconnection structure comprising vias in contact with the first conductive material filling each first trench;

f) etching a cavity in the stack to expose the first conductive material filling each of the first trenches; and g) filling said cavity with a second conductive material.

According to an embodiment, at step b), a masking layer comprising first and second openings is formed on the front side, the first openings being wider than the second openings.

According to an embodiment, said stack successively comprises a first silicon oxide layer resting on the back side, a silicon nitride layer, and a second silicon oxide layer and, at step b), the first trenches are etched all the way into the second silicon oxide layer, the nitride layer being used as an etch stop layer at step f).

The foregoing and other features and advantages will be discussed in detail in the following non-limiting description of specific embodiments in connection with the accompanying drawings.

DETAILED DESCRIPTION

Figure 1:
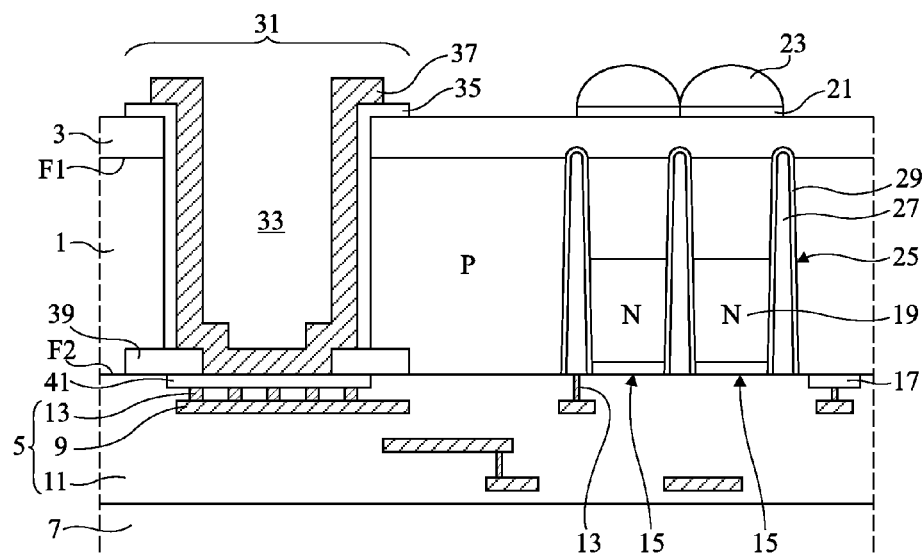
FIG. 1 is a cross-section view schematically showing an example of an image sensor.

The same elements have been designated with the same reference numerals in the various drawings and, further, the various drawings are not to scale.

In the following description, when reference is made of terms qualifying the position and orientation such as "left-hand", "right-hand", "bottom", "above", "under", "upper", "lower", etc., reference is made to the representation of the concerned elements in the drawings to which reference is made.

FIG. 1 is a cross-section view schematically showing an example of an image sensor.

The image sensor comprises a P-type doped semiconductor layer 1 having its back side F1 intended to receive an illumination and coated with insulating layers 3, and having its front side F2 coated with an interconnection structure 5. The assembly of semiconductor layer 1, of insulating layers 3, and of the interconnection structure is mounted on a support 7, the interconnection structure extending between support 7 and semiconductor layer 1. Interconnection structure 5, only a portion of which is shown, is formed from portions of metal layers 9 separated by insulating layers 11 crossed by vias 13.

On the right-hand side of FIG. 1, semiconductor layer 1 comprises photodiodes 15 and components such as transistors formed on front side F2. Two photodiodes 15 corresponding to pixels and to gate 17 of a transistor are shown.

Each photodiode comprises an N-type doped layer 19 formed in semiconductor layer 1. Insulating layers 3 are used as antireflection layers and are coated, in front of each photodiode 15, with a color filter 21 topped with a lens 23. Walls 25 made of semiconductor material 27 lined with an insulating layer 29 extend through semiconductor layer 1 from its front side F2 and separate the photodiodes from one another. At the level of front side F2, the image sensor components and conductive material 27 of walls 25 are in contact with vias 13 of interconnection structure 5.

On the left-hand side of FIG. 1, an insulated connection 31 enables to create a contact between an element of interconnection structure 5 and a pad, not shown, formed on the back side of the image sensor. Insulated connection 31 is formed from an opening 33 having its lateral walls coated with an insulating layer 35, and with a metal layer 37 coating insulating layer 35 and the bottom of opening 33. Opening 33 is wider than walls 25 for example, 100 times wider. Opening 33 extends from the exposed surface of stack 3 of insulating layers all the way to front side F2 of semiconductor layer 1, and crosses a silicon oxide layer 39 formed in semiconductor layer 1 on its front side F2. At the bottom of opening 33, metal layer 37 is in contact with a doped polysilicon layer 41 which is connected by vias 13 to an element of the interconnection structure.

In practice, this image sensor comprises many insulated connections 31 and, in top view, not shown, insulated connections 31 are arranged around a central area of the image sensor having photodiodes 15 and the associated components formed therein.

To manufacture the image sensor of FIG. 1, walls 25 are formed from front side F2 of semiconductor layer 1, after which the interconnection structure is formed on side F2. The assembly of semiconductor layer 1 and of interconnection structure 5 is then mounted on support 7 as shown in FIG. 1. Then, only openings 33 are formed by reactive ion etching from the exposed surface of stack 3, or back side of the sensor, and insulated connections 31 are formed in openings 33.

This manufacturing method implies providing a succession of steps carried out from the back side of the sensor to form openings 33 and insulated connections 31 running from this back side to front side F2 of the semiconductor layer. This complicates the sensor manufacturing method and brings about several disadvantages. Due to the fact that the openings are formed from the back side of the sensor and that they have a significant width, currently a side length or a diameter greater than 50 μm, it is difficult to obtain a sensor having a planar back side, which complicates the forming of filters 21 and of lenses 23 on this side. The forming of openings 33 by reactive ion etching introduces fixed charges into semiconductor layer 1 and into components of the sensor, which disturbs its proper operation. Further, on etching of openings 33, polysilicon layer 41 may be over-etched, which may degrade the quality of the electric connection between interconnection structure 5 and insulated connection 31.

Figure 2:
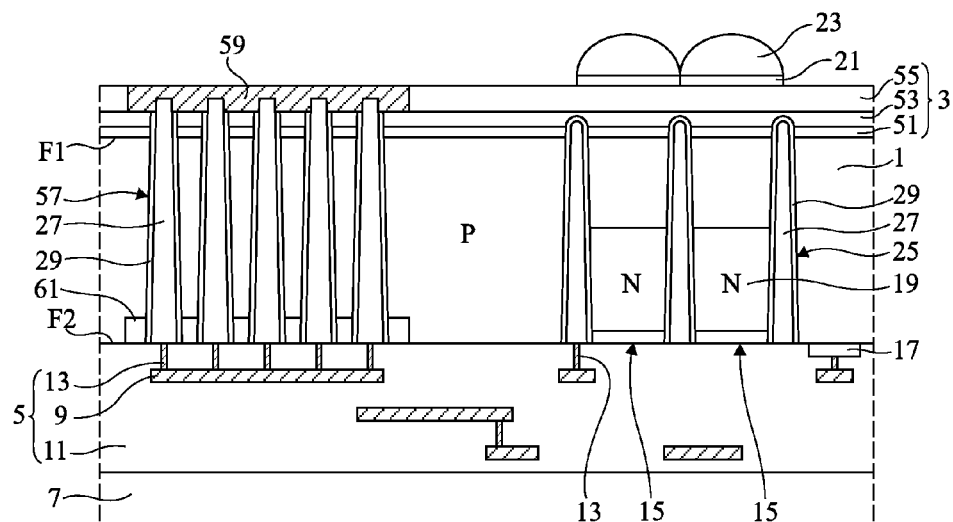
FIG. 2 is a cross-section view schematically showing an embodiment of an image sensor.

FIG. 2 is a cross-section view showing an embodiment of an image sensor.

The image sensor comprises, on a support 7, an interconnection structure 5, a P-type doped semiconductor layer 1, and a stack 3 of insulating layers. Elements 1, 3, 5, and 7 are arranged relative to one another in the same way as in FIG. 1. More particularly, in this example, stack 3 successively comprises insulating layers 51, 53, and 55, layer 51 resting on back side F1 of semiconductor layer 1.

On the right-hand side of FIG. 2, the sensor comprises photodiodes 15, components such as transistors, walls 25 separating the photodiodes, and filters 21 resting on stack 3 opposite the photodiodes, each filter being topped with a lens 23. As previously described, walls 25 are made of a conductive material 27 lined with an insulating layer 29 and extending through semiconductor layer 1 from its front side F2. In this example, walls 25 penetrate into insulating layer 53 of stack 3. At the level of front side F2, image sensor components and walls 25 are connected to vias 13 of interconnection structure 5.

On the left-hand side of FIG. 2, fingers 57 made of conductive material 27 laterally lined with an insulating layer 29 enable to create a contact between an element of interconnection structure 5 and a metal pad 59 formed on the back side of the sensor. Each finger 57 extends from front side F2 of semiconductor layer 1 and penetrates into pad 59, and the portion of the finger penetrating into the pad is not lined with insulating layer 29. Metal pad 59 is flush with the back side of the sensor and, in this example, extends along the entire height of insulating layer 55. On front side F2, semiconductor layer 1 may comprise a shallow recess filled with an insulator 61 lining a lower portion of each finger 57. At the level of front side F2, fingers 57 are connected to an element of interconnection structure 5 by vias 13. Thus, fingers 57 are used as an insulated connection between pad 59 formed on the back side of the sensor and vias 13 of the interconnection structure arranged on front side F2 of semiconductor layer 1.

FIGS. 3A to 3E are simplified cross-section views illustrating successive steps of an embodiment of the image sensor of FIG. 2.

Figure 3A:
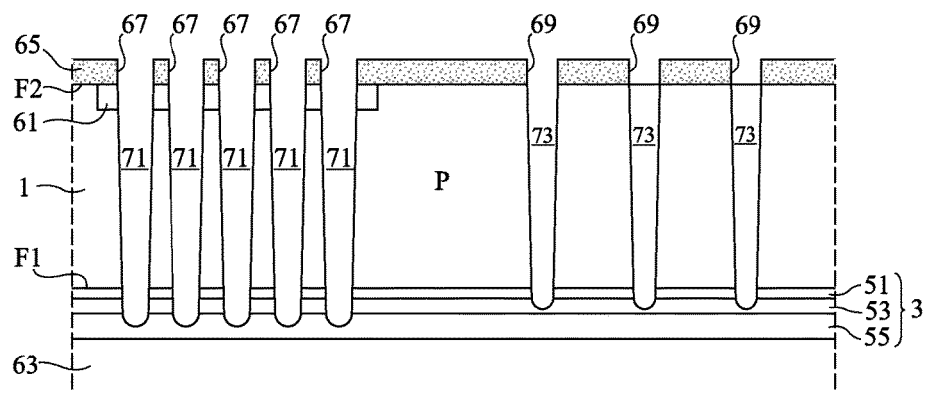
FIGS. 3A to 3E are simplified cross-section views illustrating successive steps of a method of manufacturing the image sensor of FIG. 2.

FIG. 3A shows a structure successively comprising a semiconductor layer 1, a stack 3 of successive insulating layers 51, 53, and 55, and a handle or a support 63 such as a silicon wafer, insulating layer 51 resting on a side F1 of semiconductor layer 1. A masking layer 65 has been deposited on side F2 of semiconductor layer 1 opposite to its side F1. Masking layer 65 comprises openings 67 and 69 at the locations where fingers and walls are desired to be formed, respectively. In this example, the semiconductor layer comprises a shallow recess filled with an insulator 61 formed on side F2 above openings 67. Trenches 71 and 73 are simultaneously formed through semiconductor layer 1 all the way into stack 3 of insulating layers 51, 53, and 55 by etching from openings 67 and from openings 69 respectively. Openings 67 are selected to be wider than openings 69 so that trenches 71 are deeper than trenches 73. In this example, trenches 71 cross insulating layers 51 and 53 and penetrate into insulating layer 55, and trenches 73 cross insulating layer 51 and penetrate into insulating layer 53.

Semiconductor layer 1 may be made of silicon, germanium, or of any other semiconductor material capable of forming an image sensor. In this example, layer 1 is P-type doped. Stack 3 may be formed of a silicon oxide layer 51 formed by thermal oxidation, of a silicon nitride layer 53, and of a deposited silicon oxide layer 55. The width of trenches 71 and 73 is for example smaller than 2 μm, preferably smaller than 0.5 μm, and may be equal to 0.35 μm and 0.2 μm, respectively. The thickness of semiconductor layer 1 may be in the range from 2 to 5 μm, and is for example equal to 3 μm. The thickness of thermal oxide layer 51 may be in the range from 5 to 20 nm, and is for example equal to 7.5 nm. The thickness of silicon nitride layer 53 may be in the range from 30 to 80 nm, and is for example equal to 55 nm. The thickness of deposited oxide layer 55 may be in the range from 80 to 200 nm, and is for example equal to 100 nm.

Figure 3B:
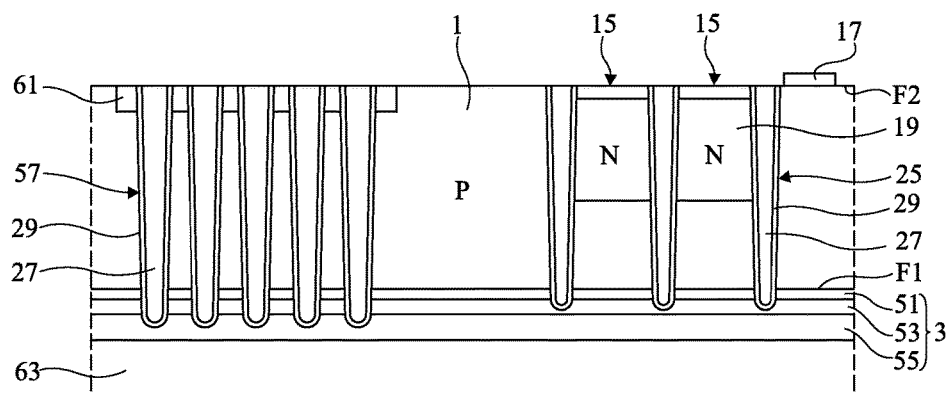

FIG. 3B shows the structure of FIG. 3A after the deposition of an insulating layer 29 which covers the walls of trenches 71 and 73, followed by the deposition of a layer of a conductive material 27 which fills trenches 71 and 73. Fingers 57 of an insulated connection and insulated conductive wall 25 are thus formed. Material 27, insulating layer 29, and masking layer 65 have been removed from surface F2. Before or after the forming of walls 25 and of fingers 57, the image sensor components are formed in semiconductor layer 1 from its surface F2. These components for example include photodiodes 15 each comprising an N-type doped layer 19 extending between walls 25 and transistors, a gate 17 thereof being schematized.

As an example, conductive material 27 may be heavily-doped polysilicon, for example, of type P, where the dopant atom concentration may be greater than $10^{19}$ at·cm$^{-3}$. Insulating layer 29 may be formed of a silicon oxide layer coated with a silicon nitride layer used as a diffusion barrier. The thickness of insulating layer 29 may be in the range from 5 to 30 nm, and is for example equal to 25 nm.

Figure 3C:
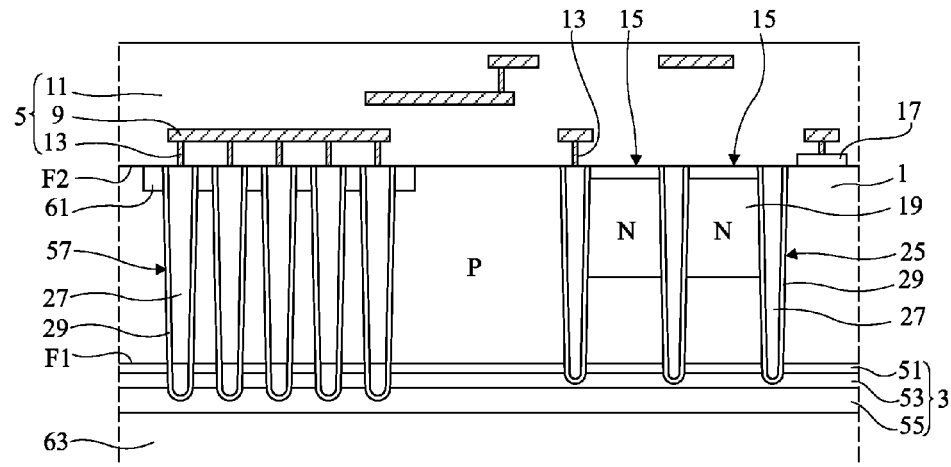

FIG. 3C shows the structure of FIG. 3B after the forming of an interconnection structure 5 on side F2 of semiconductor layer 1 by successive steps of depositing and etching insulating layers 11 and metal layers. These steps are carried out so that interconnection structure 5 comprises elements, for example, vias 13, connected to components of the image sensor and to conductive material 27 of walls 25 and of fingers 57.

Figure 3D:
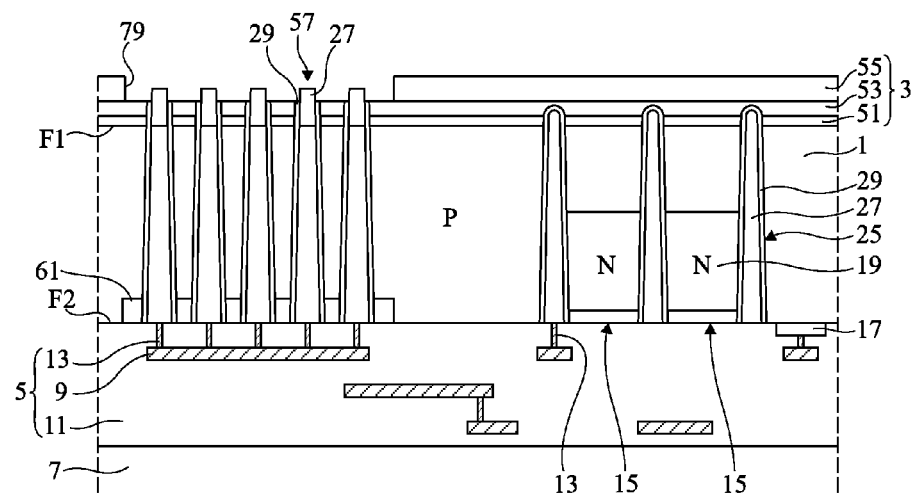

FIG. 3D shows the structure of FIG. 3C flipped and fixed to a handle or a support 7 such as a silicon wafer, interconnection structure 5 extending between support 7 and semiconductor layer 1. Support 63 has been removed. Above fingers 57, a cavity 79 has been etched in insulating stack 3 so that a portion of conductive material 27 of each finger 57 protrudes above the bottom of cavity 79. In this example, insulating layer 53 of stack 3 is used as an etch stop layer and cavity 79 extends along the entire height of insulating layer 55.

Figure 3E:
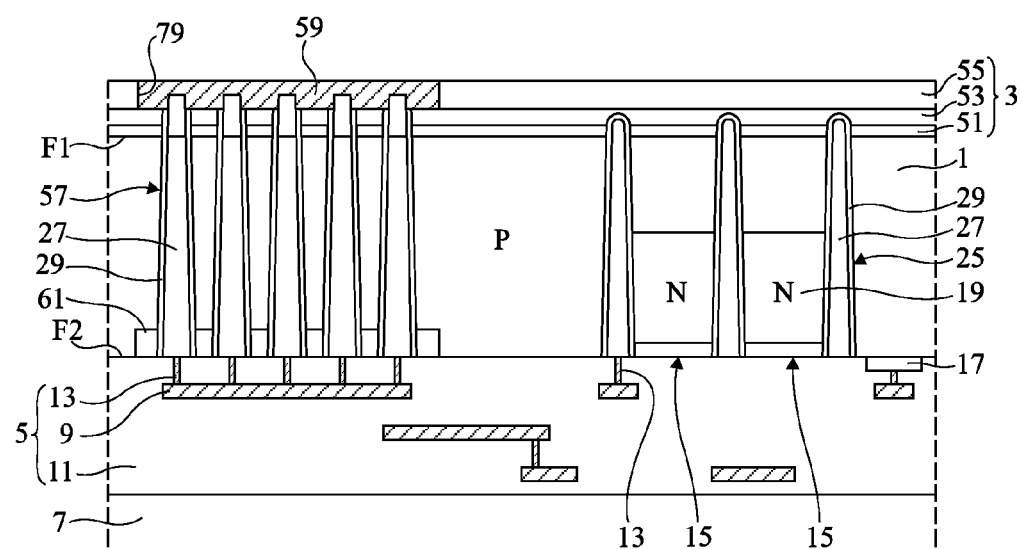

FIG. 3E shows the structure of FIG. 3D after forming in cavity 79 a conductive pad 59 for example comprising a tantalum and/or tantalum nitride layer topped with an aluminum layer. Pad 59 is flush with the exposed surface of stack 3 and the sensor has a planar back side. At next steps, not shown, an assembly of a color filter 21 topped with a lens 23 is formed on the back side of the sensor, opposite each photodiode.

As previously described in relation with FIGS. 3A to 3E, in the method of manufacturing an image sensor of the type in FIG. 2, insulated conductive walls 25 and insulated connections formed from fingers 57 are simultaneously formed from the same front side F2 of a semiconductor layer 1.

This simultaneous forming of insulated conductive walls 25 and of fingers 57 of connection from the front side of the sensor has many advantages. First, it results in a decrease of the number of manufacturing steps of an image sensor of the type in FIG. 2 as compared with a sensor of the type in FIG. 1. Another advantage is that the back side of the sensor is planar and thus that the steps of forming color filters 21 and lenses 23 on this surface are simpler to implement than in a sensor of the type in FIG. 1.

Further, to compare an insulated connection of the type in FIG. 1 with an insulated connection of the type in FIG. 2, tests carried out by the inventors have shown that an insulated connection of the type in FIG. 2 has a total access resistance smaller than that of an insulated connection of the type in FIG. 2. This may particularly be imputed to the fact that the contact resistance between conductive fingers 57 of an insulated connection of the type in FIG. 2 and vias 13 of an interconnection structure 5 is particularly low.

Specific embodiments have been described. Various alterations, modifications, and improvements will readily occur to those skilled in the art. In particular, it should be understood that fingers 57 may be used as an insulated connection between two opposite sides of a semiconductor layer in the case where a device other than an image sensor is formed in this semiconductor layer, for example, a device comprising no photodiodes.

The dimensions, the conductivity types, and the materials of the various regions previously indicated as an example may be adapted by those skilled in the art. For example, semiconductor layer 1 may be N-type doped, layer 19 of each photodiode 15 then P-type doped. A stack 3 of insulating layers comprising other layers than those previously indicated may also be provided.

Steps of the manufacturing method may be modified, added or suppressed and the order in which these steps are carried out may be adapted by those skilled in the art. In particular, the width of openings 69 and 71 may be adapted according to the depth of trenches 71 and 73 which are desired to be formed and these trenches may penetrate into stack 3 of insulating layers all the way to levels different from those previously indicated. It is possible to form no insulator 61 in semiconductor layer 1.

Such alterations, modifications, and improvements are intended to be part of this disclosure, and are intended to be within the spirit and the scope of the present invention. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   manufacturing an image sensor, the manufacturing including:
   forming a stack of dielectric layers on a back side of a semiconductor layer, the semiconductor layer have a front side opposite to the back side;
   simultaneously etching, starting from a front side of the semiconductor layer, first and second trenches through the semiconductor layer and into the stack to first and second depths, respectively, the first depths of the first trenches being deeper into the stack than the second depths of the second trenches;
   forming pixels in the semiconductor layer, the second trenches separating the pixel from each other;
   forming a dielectric liner layer on walls of the first and second trenches;
   filling the first and second trenches with a layer of a first conductive material, wherein filling the first and second trenches includes forming laterally-insulated conductive fingers extending through the semiconductor layer from a front side of the semiconductor layer and forming conductive walls that, together with the dielectric liner layer in second trenches, separate the pixels from each other, the walls extending through the semiconductor layer from the front side and having a lower height than the fingers;

forming a conductive layer extending along part of a height of the stack and flush with an exposed surface of the stack, the conductive layer portion contacting the conductive fingers; and forming an interconnection structure on the front side of the semiconductor layer and including vias in contact with the fingers.

2. The method of claim 1, wherein forming the conductive layer includes:

etching a cavity into said stack;

filling the cavity with a second conductive material.

3. The method of claim 1, wherein:

forming the interconnection structure includes forming vias in contact with the first conductive material filling each first trench and forming a via in contact with one of the conductive walls.

4. The method of claim 1, wherein;

forming said stack comprises successively forming a first silicon oxide layer on the back side, forming a silicon nitride layer on the first silicon oxide layer, and forming a second silicon oxide layer on the silicon nitride layer;

etching the first trenches includes etching the first trenches into the second silicon oxide layer; and etching the cavity includes etching the cavity into the second silicon oxide layer while using the nitride layer as an etch stop layer that prevents etching through the nitride layer.

5. The method of claim 1, further comprising forming a masking layer, having first and second openings, on the front side of the semiconductor layer prior to etching the first and second trenches, the first openings being wider than the second openings.

6. A method, comprising:

manufacturing an image sensor, the manufacturing including:

forming insulating dielectric layer on a first side of a semiconductor layer;

simultaneously etching first trenches and second trenches starting from a second side of the semiconductor layer, the second trenches being shallower than the first trenches;

forming dielectric liners on walls of the first and second trenches;

filling the first and second trenches with a first conductive material; and forming a plurality of pixels in the semiconductor layer, the second trenches separating the pixels from each other.

7. The method of claim 6, wherein the first trenches extend into the dielectric layer.

8. The method of claim 6, comprising:

on the second side of the semiconductor layer, forming an interconnection structure including vias in contact with the first conductive material filling each first trench.

9. The method of claim 6, wherein forming the dielectric layer includes forming a stack of dielectric insulating layers, the method further comprising:

etching a cavity in the stack to expose the first conductive material filling each of the first trenches; and filling said cavity with a second conductive material.

10. The method of claim 9, wherein forming the stack of dielectric layers includes forming a first silicon oxide layer on the first side, forming a silicon nitride layer on the first silicon oxide layer, and forming a second silicon oxide layer on the silicon nitride layer.

11. The method of claim 10, wherein:

etching the first trenches includes etching the first trenches into the second silicon oxide layer; and etching the cavity includes etching the cavity while using the nitride layer as an etch stop layer that prevents etching through the nitride layer.

12. The method of claim 6, further comprising forming a masking layer, having first and second openings, on the second side of the semiconductor layer prior to etching the first and second trenches, the first openings being wider than the second openings.

13. The method of claim 6, further comprising forming a conductive layer extending into the stack, the conductive fingers extending into the conductive layer, and the conductive layer being a second conductive material that is different from the first conductive material.

14. The method of claim 1, wherein:

etching a cavity into said stack includes exposing top sides and upper sidewalls of the conductive fingers by etching a portion of one of the dielectric layers of the stack and etching portions of the dielectric liners covering the upper sidewalls;

filling the cavity with a second conductive material that contacts the top sides and upper sidewalls of the conductive fingers.

* * * * *